United States Patent
Kom et al.

[11] Patent Number: 6,150,711
[45] Date of Patent: Nov. 21, 2000

[54] MULTI-LAYER PLATED LEAD FRAME

[75] Inventors: Joong-do Kom; Young-ho Baek; Kyung-soon Bok, all of Yongin, Rep. of Korea

[73] Assignee: Samsung Aerospace Industries, Ltd, Kyongsangnam-Do, Rep. of Korea

[21] Appl. No.: 09/026,509

[22] Filed: Feb. 19, 1998

[30] Foreign Application Priority Data

Feb. 20, 1997 [KR] Rep. of Korea ............... 97-5102

[51] Int. Cl.[7] .............................. H01L 23/495
[52] U.S. Cl. ........................... 257/677; 257/766
[58] Field of Search ................ 257/668, 677, 257/692, 693, 736, 748, 762, 766, 750, 763, 768, 770; 438/123; 361/723, 772, 776, 813

[56] References Cited

U.S. PATENT DOCUMENTS

| | | | |
|---|---|---|---|
| 3,648,355 | 3/1972 | Shida et al. ........................ | 29/471.7 |
| 4,141,029 | 2/1979 | Dromsky ............................. | 257/677 |
| 4,911,798 | 3/1990 | Abys et al. ......................... | 204/44 |
| 4,917,967 | 4/1990 | Cupolo et al. ..................... | 428/669 |
| 5,001,546 | 3/1991 | Butt ..................................... | 257/666 |
| 5,138,431 | 8/1992 | Huang et al. ...................... | 257/677 |
| 5,221,859 | 6/1993 | Kobayashi et al. ............... | 257/676 |
| 5,360,991 | 11/1994 | Abys et al. ......................... | 257/666 |
| 5,436,082 | 7/1995 | Mathew ............................... | 428/670 |
| 5,454,929 | 10/1995 | Kinghorn ............................ | 205/128 |
| 5,486,721 | 1/1996 | Herklotz et al. .................. | 257/666 |
| 5,650,661 | 7/1997 | Mathew ............................... | 257/677 |
| 5,801,436 | 9/1998 | Serizawa ............................. | 257/677 |
| 5,882,955 | 3/1999 | Huang et al. ...................... | 438/111 |
| 5,994,767 | 11/1999 | Huang et al. ...................... | 257/666 |

FOREIGN PATENT DOCUMENTS

| | | |
|---|---|---|
| 0 335 608 | 10/1989 | European Pat. Off. . |
| 0 751 564 A2 | 1/1997 | European Pat. Off. . |
| 5-90465 | 4/1993 | Japan . |

*Primary Examiner*—John Guay
*Assistant Examiner*—Alonzo Chambliss
*Attorney, Agent, or Firm*—Finnegan, Henderson, Farabow, Garrett & Dunne, LLP

[57] ABSTRACT

A multi-layer plated lead frame is provided. The lead frame has a structure in which a first precious metal plating layer, an intermediate plating layer, and a second precious metal plating layer are sequentially formed on a substrate made of ferroalloy. The lead frame shows improvement in all properties including wire bonding, anti-corrosion, and solderability.

5 Claims, 3 Drawing Sheets

MULTI-LAYER PLATED LEAD FRAME

BACKGROUND OF THE INVENTION

The present invention relates to a lead frame, and more particularly, to a multi-layer plated lead frame in which the structure of a plating layer is improved, such that a pre-plated frame (PPF) process is applied to a substrate made of an ferroalloy (Fe).

A semiconductor lead frame is an important element of a semiconductor package, together with the semiconductor chip. The lead frame connects the inside of the semiconductor package to the outside thereof, and supports the semiconductor chip. In general, such a semiconductor lead frame is manufactured by a stamping or etching method.

According to the stamping method, a thin plate material is formed into a predetermined shape using a press molding apparatus. Such a stamping method is mainly applied for mass producing lead frames.

Alternatively, the etching method is a chemical etching in which a predetermined portion of the material is eroded using a chemical, and this method is generally used to manufacture small quantities of lead frames.

A semiconductor lead frame manufactured by one of the above methods may include various structures according to the mounting type of lead frame on the substrate. FIG. 1 shows a general structure of the semiconductor lead frame.

In FIG. 1, the lead frame includes a die pad 11 for mounting and fixing a memory chip thereon, an inner lead 12 connected to the chip by wire bonding, and an outer lead 13 for connection with an external circuit.

The semiconductor lead frame having this structure forms a semiconductor package through assembly with other parts of the semiconductor, e.g., a memory chip.

In order to improve wire bonding between the semiconductor chip and the inner lead 12 of the lead frame, the die pad 11 and the inner lead 12 are plated with a metal. Also, in order to improve solderability, a solder plating is performed on a predetermined portion of the outer lead 13.

However, during the solder plating, a plating solution frequently encroaches on a region of the inner lead 12, so that an extra step of removing the unwanted plating solution is necessary.

To solve the problem, a pre-plated frame (PPF) method has been suggested. According to the pre-plated frame method, a material having excellent solder wettability is coated on a substrate prior to the semiconductor packaging process, to form a plating layer. Structures of the plating layer obtained by the above method are shown in FIGS. 2, 3 and 4.

Referring to FIG. 2, a nickel (Ni) plating layer 22, and a palladium (Pd) or Pd/Ni alloy plating layer 23, are sequentially formed on a copper (Cu) substrate 21, forming a multi-layer plating layer.

The lead frame of FIG. 3 includes a Ni plating layer 32, a Pd/Ni alloy plating layer 33, a Ni plating layer 34, and a Pd plating layer 35, wherein the plating layers 32, 33, 34 and 35 are sequentially formed on a Cu substrate 31.

According to the lead frame of FIG. 4, a Ni plating layer 42 and a Pd or gold (Au) plating layer 43, are sequentially formed on a Cu substrate 41. Also, a Pd/Ni alloy plating layer 44, a Pd or Au plating layer 43' and a Pd plating layer 45 are formed on the Pd or Au plating layer 43.

The lead frames of FIGS. 2 through 4 are manufactured according to a pre-plated frame process by using Cu or Cu alloy as the substrate material. It is difficult, however, to apply the pre-plated frame process used above for forming the lead frames of FIGS. 2 through 4 on a substrate made of Alloy 42. Here, Alloy 42 consists of Ni, Fe and minor amount of other elements, and is widely used as a lead frame substrate material. However, Alloy 42 is seriously corroded by the assembly process in salty atmosphere. This is due to galvanic corrosion caused by the great difference in electrochemical potential between Fe of the Alloy 42 and Pd of the plating layer.

SUMMARY OF THE INVENTION

To solve the above problem, it is an object of the present invention to provide a lead frame having an excellent anti-corrosion property, as well as good soldering and wire bonding properties, by improving the structure of plating layers thereof.

To achieve the above object, there is provided a multi-layer plated lead frame comprising a substrate made of ferroalloy, and a first precious metal plating layer, an intermediate plating layer, and a second precious metal plating layer, which are sequentially formed on the substrate.

Preferably, the intermediate plating layer includes a copper (Cu) plating layer and a nickel (Ni) plating layer.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

The present invention is characterized in that a substrate made of ferroalloy is initially plated with a precious metal or an alloy thereof. After forming such precious metal plated layer, an intermediate plating layer and an outermost plating layer are formed, completing the plating layers. Here, a palladium (Pd) plating layer may be formed between the intermediate plating layer and the outermost plating layer. Here, the plating layer containing Pd improves adhesion between the intermediate plating layer and the outermost plating layer, as well as reducing surface roughness of the plating layers, thereby improving solderability and wire bonding properties.

The principle of the present invention will be described with reference to the Wagner's mixed kinetic electrode theory.

In the field of electrochemistry, it is generally understood that the corrosion rate of a metal can be expressed by the following equation (1).

$$I = i_0 \exp(\Delta E/\beta) \qquad (1)$$

where I is the current density, $i_0$ is an exchange current density, $\beta$ is the Tafel constant, and $\Delta E$ is the difference between an oxidation reaction potential and a reduction reaction potential.

According to the mixed kinetic electrode theory, a corrosion reaction is composed of an oxidation reaction and a reduction reaction, and the corrosion reaction rate can be determined when the oxidation reaction rate is equal to the reduction reaction rate.

Figure 5:
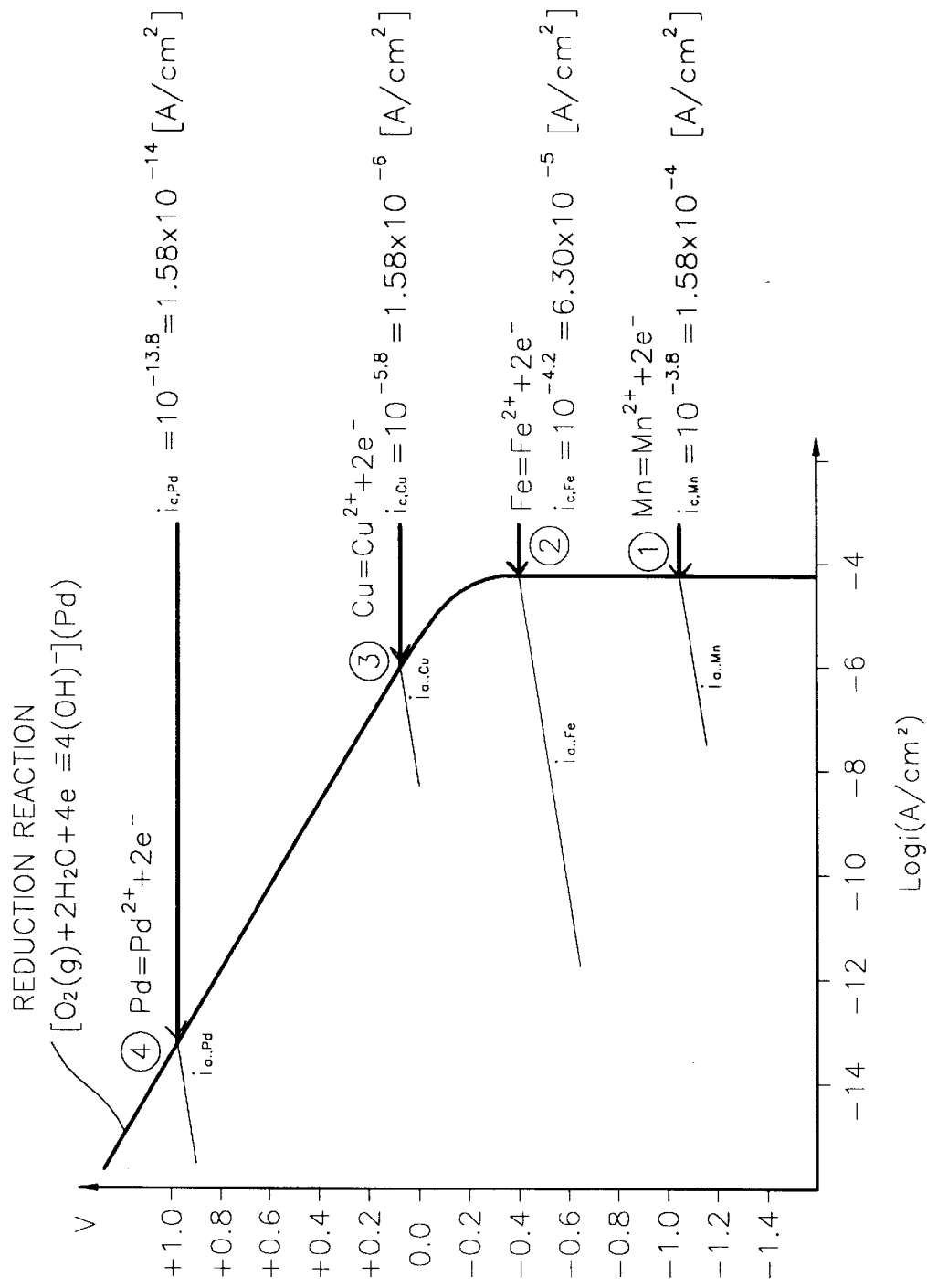
FIG. 5 is an Evans diagram.

The corrosion behavior of metal can be easily predicted using the Evans diagram shown in FIG. 5, in which the relationship between ΔE and the current density I of the equation (1) is expressed as a semi-log type.

Generally, corrosion of a metal M having a valence v occurs by the following oxidation reaction and reduction reaction.

Oxidation reaction (interface between a lead frame and a plating layer):

Reduction reaction (interface between the plating layer and atmosphere):

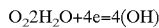

The corrosion rate of the metal can be determined at crossing points between the "ΔE-vs-log I" oxidation reaction curve and the "ΔE-vs-log I" reduction reaction curve.

In order to lower the corrosion rate of the metal, an oxidation reaction rate and a reduction reaction rate must both be reduced. However, the reduction reaction is fixed as an oxidation reduction reaction in normal and salty atmosphere. Thus, it is necessary to change the metal reduction reaction to decrease the corrosion rate of the metal.

As previously described, the metal oxidation reaction mainly occurs at the interface between a lead frame and the first metal plating layer. Thus, it becomes critically important to determine the magnitude of the electrochemical potential of the first plating layer. The corrosion rate decreases with decreasing the electrochemical potential difference between the lead frame and the first plating layer.

For example, as shown in FIG. 5, the value of the electrochemical potential of the metals increases from lowest to highest potential in the order of Mn, Fe, Cu, and Pd. And, the overall metal corrosion rate is remarkably decreased from lowest corrosion rate to highest in the order of Mn, Fe, Cu, and Pd.

In the present invention, based on the above principle, it is possible to reduce the oxidation reaction rate by plating a precious strike layer such as palladium (Pd) on an Fe lead frame, thereby slowing down the corrosion rate.

Figure 1:
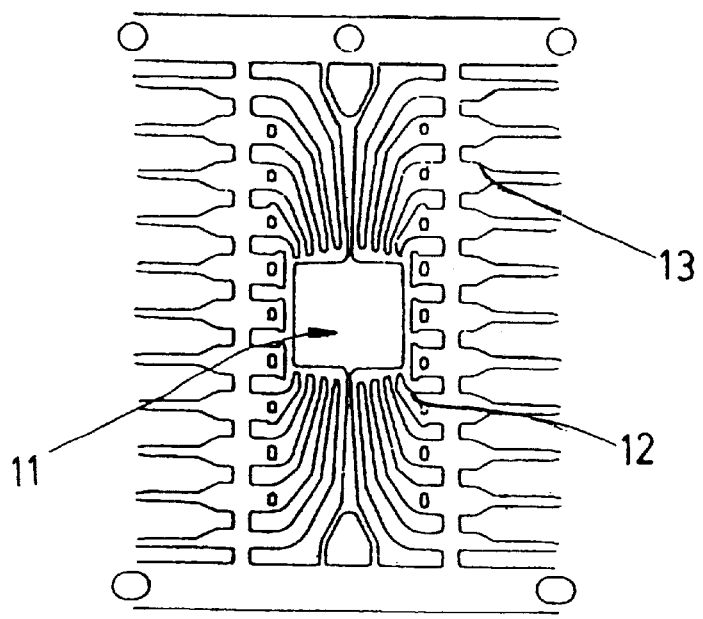
FIG. 1 is a plan view of the structure of a conventional lead frame.
Figure 2:
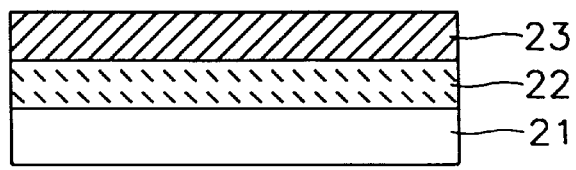
FIGS. 2, 3 and 4 are sectional views showing the structure of plating layers of a conventional lead frame.
Figure 3:
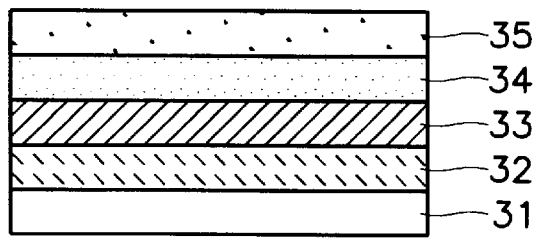
Figure 4:
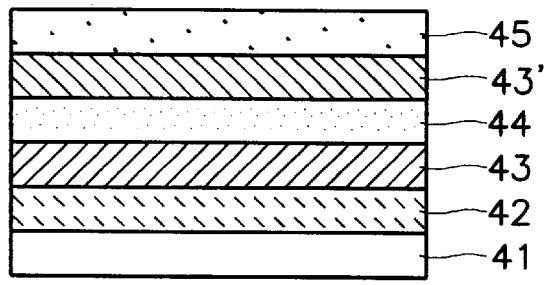
Figure 6:
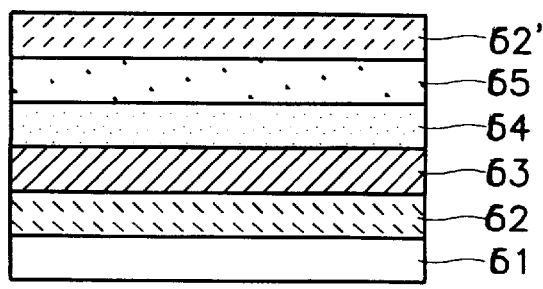
FIG. 6 is a sectional view showing the structure of plating layers of a lead frame according to the present invention.

Hereinafter, the structure of a lead frame according to a preferred embodiment of the present invention will be described with reference to FIG. 6.

A first precious metal plating layer 62, which is formed of one metal selected from the group consisting of palladium (Pd), gold (Au), platinum (Pt), rhodium (Rh), silver (Ag), Ruthenium (Ru) and alloys thereof is formed on a substrate 61 made of ferroalloy. Here, it is preferable that the thickness of the substrate is between 0.01 mm and 5 mm.

The alloy used for forming the first precious metal plating layer includes a Pd—Au alloy containing 50 wt % or less of Au, a Pd—Co alloy containing 50 wt % or less of Co, a Pd—W alloy containing 50 wt % or less of tungsten (W), a Pd—Ti alloy containing 50 wt % or less of titanium (Ti), a Pd—Sn alloy containing 50 wt % or less of tin (Sn), a Pd—Ni alloy containing 50 wt % or less of nickel (Ni), and a Pd—Mo alloy containing 50 wt % or less of molybdenum (Mo). The above percentages are based on the total weight of the alloy. The first precious metal layer reduces the electrochemical potential difference between is the oxidation and reduction, as described above, thereby improving the anti-corrosion property. Also, preferably, the first precious metal layer has a thickness of between 0.01 mm and 10 μm.

A Cu plating layer 63 is formed on the first precious metal plating layer 62, formed of Cu or Cu alloy including Cu as a major component and 50 wt % or more of another metal based on the total weight of the alloy. The other metal is selected from the group consisting of Sn, Ni, Mo, Mn and Co. Preferably, the Cu plating layer 63 has a thickness of between 0.01 mm and 10 μm.

The Cu plating layer 63 improves the adhesion between the first precious metal plating layer 62 and a Ni plating layer 64, and prevents the diffusion of metal atoms from the substrate.

The Ni plating layer 64 is formed as an intermediate layer to prevent the generation of a reactive copper product such as copper oxide or copper sulfide, which is obtained by a reaction with Cu atoms diffused to the surface of the outermost layer. The Ni plating layer 64 is formed of Ni or Ni alloy including Ni as a major component and 50 wt % or more of another metal based on the total weight of the alloy. The other metal is selected from the group consisting of Cu, Sn, Mo, Mn, Co and W. Preferably, the Ni plating layer 64 has a thickness of between 0.01 mm and 10 μm.

A Pd plating layer 65 is formed on the Ni plating layer 64, formed of Pd or Pd alloy including Pd as a major component and 50 wt % or more of another metal based on the total weight of the alloy. The other metal is selected from the group consisting of Mo, W, Ti, Sn, Ni, Ag and Co. The Pd plating layer 65 has a thickness of between 0.01 mm and 10 μm. The Pd plating layer 65 covers pores in the surface of the Ni plating layer 64, to even the surface roughness of the Ni plating layer 64. Accordingly, the thickness of the outermost layer, to be formed by a subsequent step, can be evenly maintained.

The above-described Pd plating layer 65 markedly decreases local corrosion in salty atmosphere, increasing the binding force between the Ni plating layer 64 and a second precious metal plating layer 62' as the outermost plating layer. Accordingly, in trimming and forming steps after mounting a semiconductor chip on a pad of the lead frame, the generation or widening of cracks can be minimized. As a result, solderability and wire bonding properties, as well as anti-corrosion properties, are improved by preventing the diffusion of Ni from the Ni containing plated layer 64.

The second precious metal plating layer 62' is formed on the Pd plating layer 65, and is formed of one metal selected from the group consisting of Pd, Au, Pt, Ag, Ru, Rh and alloys thereof. As the outermost plating layer, the Pd plating layer 65 protects underlying layers and prevents the oxidation of all other plating layers and improves the solderability and wire bonding property.

Here, preferably, the second precious metal plating layer 62' has a thickness of between 0.01 mm and 10 μm.

In the lead frame having the above structure, a wire bonding region, or the entire lead frame including the wire bonding region, is plated.

Hereinafter, the present invention will be described in detail with reference to examples, but the present invention is not limited to the following examples.

EXAMPLE A

After performing a pretreatment on a Fe—Ni substrate, a Pd strike layer was formed on the substrate to a thickness of approximately 3 μinches. After plating the Pd strike layer with Cu to a thickness of approximately 2 μm, the resultant structure having the Cu plating layer was sequentially plated with Ni and Ni—Pd alloy, in approximately 1 μm thickness and approximately 3 μinches, respectively. Then, a Pd plating layer having a thickness of approximately 3 μinches was formed on the plated Ni—Pd alloy plating layer. The Mo. GL-2(S)(Degussa Co.) was used for Pd plating and Ni—Pd plating, copper pyrophosphate solution (Poong Won Chemical Co.) for Cu plating, and the Mo. 6450(Degussa Co.) for Ni plating.

COMPARATIVE EXAMPLE 1

After performing a pretreatment on a substrate made of Alloy 42, the substrate was sequentially plated with Cu, Ni and Pd, thereby completing a lead frame having the structure of three plating layers.

COMPARATIVE EXAMPLE 2

After performing a pretreatment on a substrate made of Alloy 42, the substrate was sequentially plated with Ni, Cu, Ni and Pd, thereby completing a lead frame having the structure of four plating layers.

Then, a solderability test (MIL-STD-883D, Method 2003.7), a salt water spray test (MIL-STD-883D, Method 1009.8) for evaluating anti-corrosion properties under salty atmosphere, and a wire bonding test were performed on the multi-layer plated lead frames manufactured by the Example A and Comparative Examples 1 and 2. The results are shown in Table. 1.

TABLE 1

| sample | solderability | wire bonding property | anti-corrosion |
|---|---|---|---|
| Example | good | 12.01 gf (excellent) | good |
| Comparative Example 1 | poor | 4.61 gf (poor) | poor |
| Comparative Example 2 | poor | 8.40 gf (moderate) | poor |

From Table 1, it can be seen that the lead frame manufactured by Example A has a better solderability, wire bonding property and anti-corrosion property than those of Comparative Examples 1 and 2.

As described above, the lead frame according to the present invention shows improvement in all characteristics such as wire bonding, anti-corrosion and solderability. Thus, a high yield is expected in the semiconductor package process, improving productivity.

What is claimed is:

1. A multi-layer plated lead frame comprising a ferroalloy substrate, and a first precious metal plating layer, an intermediate plating layer and a second precious metal plating layer, each plating layer being sequentially formed on the ferroalloy substrate, wherein the intermediate plating layer comprises a copper (Cu) or Cu alloy plating layer and a nickel (Ni) or Ni alloy plating layer.

2. The multi-layer plated lead frame of claim 1, wherein the Cu plating layer is formed of Cu, or Cu alloy including at least one metal selected from the group consisting of tin (Sn), nickel (Ni), molybdenum (Mo), Manganese (Mn) and cobalt (Co).

3. The multi-layer plated lead frame of claim 1, wherein the Ni plating layer is formed of Ni, or Ni alloy including at least one metal selected from the group consisting of copper (Cu), tin (Sn), molybdenum (Mo), manganese (Mn), cobalt (Co) and tungsten (W).

4. The multi-layer plated lead frame of claim 1, wherein the first precious metal plating layer is formed of a metal selected from the group consisting of palladium (Pd), gold (Au), platinum (Pt), rhodium (Rh), Ruthenium(Ru), silver (Ag) and alloys thereof.

5. The multi-layer plated lead frame of claim 1, wherein the second precious metal plating layer is formed of at least one metal selected from the group consisting of palladium (Pd), gold (Au), platinum (Pt), rhodium (Rh), Ruthenium (Ru), silver (Ag) and alloys thereof.

* * * * *